US008030750B2

(12) United States Patent
Kim et al.

(10) Patent No.: US 8,030,750 B2
(45) Date of Patent: Oct. 4, 2011

(54) SEMICONDUCTOR DEVICE PACKAGES WITH ELECTROMAGNETIC INTERFERENCE SHIELDING

(75) Inventors: Seokbong Kim, Paju-Si (KR); Yeonsun Yun, Paju-Si (KR); Yuyong Lee, Paju-Si (KR)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 42 days.

(21) Appl. No.: 12/622,415

(22) Filed: Nov. 19, 2009

(65) Prior Publication Data

US 2011/0115066 A1 May 19, 2011

(51) Int. Cl.
*H01L 23/48* (2006.01)

(52) U.S. Cl. ................................ 257/690; 257/E23.141

(58) Field of Classification Search .......... 257/678–682, 257/690, E23.141; 438/106
See application file for complete search history.

(56) References Cited

U.S. PATENT DOCUMENTS 3,390,226 A 6/1968 Beyerlein
4,569,786 A 2/1986 Deguchi
4,717,948 A 1/1988 Sakai et al.
4,814,205 A 3/1989 Arcilesi et al.
4,821,007 A 4/1989 Fields et al.
5,140,745 A 8/1992 McKenzie, Jr.
5,166,772 A 11/1992 Soldner et al.
5,172,077 A 12/1992 Funada
5,353,498 A 10/1994 Fillion et al.
5,355,016 A 10/1994 Swirbel et al.
5,497,033 A * 3/1996 Fillion et al. .................. 257/723
5,557,142 A 9/1996 Gilmore et al.
5,600,181 A 2/1997 Scott et al.
5,639,989 A 6/1997 Higgins, III
5,677,511 A 10/1997 Taylor et al.
5,694,300 A 12/1997 Mattei et al.
5,703,761 A 12/1997 Heiss
5,726,612 A 3/1998 Mandai
5,729,437 A 3/1998 Hashimoto
5,776,798 A 7/1998 Quan et al.
5,847,930 A 12/1998 Kazle
(Continued)

FOREIGN PATENT DOCUMENTS

CN 1442033 A 9/2003
(Continued)

OTHER PUBLICATIONS

Lee et al. "Semiconductor Device Packages With Electromagnetic Interference Shielding." U.S. Appl. No. 12/622,419 filed Nov. 19, 2009.

(Continued)

*Primary Examiner* — Nathan W Ha
(74) *Attorney, Agent, or Firm* — Cooley LLP

(57) ABSTRACT

Described herein are semiconductor device packages with EMI shielding and related methods. In one embodiment, a semiconductor device package includes a circuit substrate, an electronic device, an encapsulant, and a conductive layer. The substrate includes a carrying surface, an opposing bottom surface, and a pad. The device is disposed adjacent to the carrying surface and is electrically connected to the substrate. The encapsulant is disposed adjacent to the carrying surface, encapsulates the device, and includes a center portion and a surrounding peripheral portion that is less thick than the center portion. An opening exposing the pad is formed in the peripheral portion. The conductive layer conformally covers the encapsulant and traverses the opening to connect to the pad.

19 Claims, 11 Drawing Sheets

U.S. PATENT DOCUMENTS

| | | | | |
|---|---|---|---|---|
| 5,864,088 | A | 1/1999 | Sato et al. | |
| 5,886,876 | A | 3/1999 | Yamaguchi | |
| 5,895,229 | A | 4/1999 | Carney et al. | |
| 5,898,344 | A | 4/1999 | Hayashi | |
| 5,966,052 | A | 10/1999 | Sakai | |
| 5,977,626 | A | 11/1999 | Wang et al. | |
| 5,998,867 | A | 12/1999 | Jensen et al. | |
| 6,079,099 | A | 6/2000 | Uchida et al. | |
| 6,093,972 | A | 7/2000 | Carney et al. | |
| 6,150,193 | A | 11/2000 | Glenn | |
| 6,194,250 | B1 | 2/2001 | Melton et al. | |
| 6,225,694 | B1 | 5/2001 | Terui | |
| 6,255,143 | B1 | 7/2001 | Briar | |
| 6,261,680 | B1 | 7/2001 | Denman | |
| 6,369,335 | B1 | 4/2002 | Wajima | |
| 6,376,769 | B1 | 4/2002 | Chung | |
| 6,448,632 | B1 | 9/2002 | Takiar et al. | |
| 6,455,864 | B1 | 9/2002 | Featherby et al. | |
| 6,472,598 | B1 | 10/2002 | Glenn | |
| 6,472,743 | B2 | 10/2002 | Huang et al. | |
| 6,479,903 | B2 | 11/2002 | Briar | |
| 6,492,194 | B1 | 12/2002 | Bureau et al. | |
| 6,521,978 | B2 | 2/2003 | Fenk et al. | |
| 6,566,596 | B1 | 5/2003 | Askew | |
| 6,586,822 | B1 | 7/2003 | Vu et al. | |
| 6,602,737 | B2 | 8/2003 | Wu | |
| 6,614,102 | B1 | 9/2003 | Hoffman et al. | |
| 6,635,953 | B2 | 10/2003 | Wu | |
| 6,686,649 | B1 | 2/2004 | Mathews et al. | |
| 6,695,985 | B2 | 2/2004 | Igarashi et al. | |
| 6,740,546 | B2 | 5/2004 | Corisis et al. | |
| 6,740,959 | B2 | 5/2004 | Alcoe et al. | |
| 6,757,181 | B1 | 6/2004 | Villanueva | |
| 6,781,231 | B2 | 8/2004 | Minervini | |
| 6,800,804 | B2 | 10/2004 | Igarashi et al. | |
| 6,838,776 | B2 | 1/2005 | Leal et al. | |
| 6,856,007 | B2 | 2/2005 | Warner | |
| 6,865,084 | B2 | 3/2005 | Lin et al. | |
| 6,867,480 | B2 | 3/2005 | Legaspi, Jr. et al. | |
| 6,881,896 | B2 | 4/2005 | Ebihara | |
| 6,900,383 | B2 | 5/2005 | Babb et al. | |
| 6,928,719 | B2 | 8/2005 | Kim et al. | |
| 6,962,869 | B1 | 11/2005 | Bao et al. | |
| 6,967,403 | B2 | 11/2005 | Chuang et al. | |
| 6,975,516 | B2 | 12/2005 | Asahi et al. | |
| 6,992,400 | B2 | 1/2006 | Tikka et al. | |
| 6,998,532 | B2 | 2/2006 | Kawamoto et al. | |
| 7,012,323 | B2 * | 3/2006 | Warner et al. | 257/676 |
| 7,030,469 | B2 | 4/2006 | Mahadevan et al. | |
| 7,045,385 | B2 | 5/2006 | Kim et al. | |
| 7,049,682 | B1 | 5/2006 | Mathews et al. | |
| 7,081,661 | B2 | 7/2006 | Takehara et al. | |
| 7,125,744 | B2 | 10/2006 | Takehara et al. | |
| 7,126,218 | B1 * | 10/2006 | Darveaux et al. | 257/706 |
| 7,161,252 | B2 | 1/2007 | Tsuneoka et al. | |
| 7,180,012 | B2 | 2/2007 | Tsuneoka et al. | |
| 7,183,498 | B2 | 2/2007 | Ogura et al. | |
| 7,186,928 | B2 | 3/2007 | Kikuchi et al. | |
| 7,187,060 | B2 | 3/2007 | Usui | |
| 7,294,587 | B2 | 11/2007 | Asahi et al. | |
| 7,327,015 | B2 | 2/2008 | Yang et al. | |
| 7,342,303 | B1 | 3/2008 | Berry et al. | |
| 7,372,151 | B1 | 5/2008 | Fan et al. | |
| 7,445,968 | B2 | 11/2008 | Harrison et al. | |
| 7,446,265 | B2 | 11/2008 | Krohto et al. | |
| 7,451,539 | B2 | 11/2008 | Morris et al. | |
| 7,478,474 | B2 | 1/2009 | Koga | |
| 7,488,903 | B2 | 2/2009 | Kawagishi et al. | |
| 7,566,955 | B2 * | 7/2009 | Warner | 257/678 |
| 7,576,415 | B2 | 8/2009 | Cha et al. | |
| 7,629,674 | B1 | 12/2009 | Foster | |
| 7,633,170 | B2 | 12/2009 | Yang et al. | |
| 7,633,765 | B1 | 12/2009 | Scanlan et al. | |
| 7,656,047 | B2 | 2/2010 | Yang et al. | |
| 7,700,411 | B2 | 4/2010 | Yang et al. | |
| 7,741,151 | B2 * | 6/2010 | Amrine et al. | 438/107 |
| 7,745,910 | B1 | 6/2010 | Olson et al. | |
| 7,772,046 | B2 | 8/2010 | Pagaila et al. | |
| 7,829,981 | B2 | 11/2010 | Hsu | |
| 2002/0053724 | A1 | 5/2002 | Lai et al. | |
| 2002/0093108 | A1 | 7/2002 | Grigorov | |
| 2004/0020673 | A1 | 2/2004 | Mazurkiewicz | |
| 2004/0063242 | A1 | 4/2004 | Karnezos | |
| 2004/0150097 | A1 | 8/2004 | Gaynes et al. | |
| 2004/0178500 | A1 | 9/2004 | Usui | |
| 2004/0231872 | A1 | 11/2004 | Arnold et al. | |
| 2004/0252475 | A1 | 12/2004 | Tsuneoka et al. | |
| 2005/0013082 | A1 | 1/2005 | Kawamoto et al. | |
| 2005/0029673 | A1 | 2/2005 | Naka et al. | |
| 2005/0039946 | A1 | 2/2005 | Nakao | |
| 2005/0045358 | A1 | 3/2005 | Arnold | |
| 2005/0046001 | A1 * | 3/2005 | Warner | 257/678 |
| 2005/0208702 | A1 | 9/2005 | Kim | |
| 2006/0145361 | A1 | 7/2006 | Yang et al. | |
| 2006/0148317 | A1 | 7/2006 | Akaike et al. | |
| 2006/0160261 | A1 | 7/2006 | Sheats et al. | |
| 2006/0266547 | A1 | 11/2006 | Koga | |
| 2007/0241437 | A1 * | 10/2007 | Kagaya et al. | 257/678 |
| 2008/0061407 | A1 | 3/2008 | Yang et al. | |
| 2008/0128890 | A1 | 6/2008 | Choi et al. | |
| 2008/0174013 | A1 | 7/2008 | Yang et al. | |
| 2008/0042301 | A1 | 8/2008 | Yang et al. | |
| 2009/0000114 | A1 | 1/2009 | Rao et al. | |
| 2009/0000815 | A1 | 1/2009 | Hiner et al. | |
| 2009/0000816 | A1 | 1/2009 | Hiner et al. | |
| 2009/0002969 | A1 | 1/2009 | Madsen et al. | |
| 2009/0002970 | A1 | 1/2009 | Leahy et al. | |
| 2009/0002971 | A1 | 1/2009 | Carey et al. | |
| 2009/0002972 | A1 | 1/2009 | Carey et al. | |
| 2009/0025211 | A1 | 1/2009 | Hiner et al. | |
| 2009/0027863 | A1 * | 1/2009 | Karnezos | 361/764 |
| 2009/0035895 | A1 | 2/2009 | Lee et al. | |
| 2009/0075428 | A1 | 3/2009 | Tang et al. | |
| 2009/0102003 | A1 | 4/2009 | Vogt et al. | |
| 2009/0102033 | A1 | 4/2009 | Raben | |
| 2009/0194851 | A1 | 8/2009 | Chiu et al. | |
| 2009/0194852 | A1 | 8/2009 | Chiu et al. | |
| 2009/0230487 | A1 | 9/2009 | Saitoh et al. | |
| 2009/0230523 | A1 | 9/2009 | Chien et al. | |
| 2009/0230524 | A1 | 9/2009 | Chien et al. | |
| 2009/0230525 | A1 | 9/2009 | Chien et al. | |
| 2009/0230526 | A1 | 9/2009 | Chen et al. | |
| 2009/0236700 | A1 | 9/2009 | Moriya | |
| 2009/0256244 | A1 | 10/2009 | Liao et al. | |
| 2009/0261470 | A1 | 10/2009 | Choi et al. | |
| 2009/0294928 | A1 | 12/2009 | Kim et al. | |
| 2009/0302446 | A1 * | 12/2009 | Lee et al. | 257/680 |
| 2010/0006330 | A1 | 1/2010 | Fu et al. | |
| 2010/0013064 | A1 | 1/2010 | Hsu | |
| 2010/0032815 | A1 | 2/2010 | An et al. | |
| 2010/0109132 | A1 | 5/2010 | Ko et al. | |
| 2010/0110656 | A1 | 5/2010 | Ko et al. | |
| 2010/0207257 | A1 | 8/2010 | Lee | |
| 2010/0207258 | A1 | 8/2010 | Eun et al. | |
| 2010/0207259 | A1 | 8/2010 | Liao et al. | |
| 2011/0006408 | A1 | 1/2011 | Liao | |

FOREIGN PATENT DOCUMENTS

| | | | |
|---|---|---|---|
| CN | 1774804 | A | 5/2006 |
| JP | 55044737 | | 3/1980 |
| JP | 58122759 | | 7/1983 |
| JP | 59051555 | | 3/1984 |
| JP | 63262860 | | 10/1988 |
| JP | 64037043 | | 2/1989 |
| JP | 64064298 | | 3/1989 |
| JP | 02078299 | | 3/1990 |
| JP | 03023654 | | 1/1991 |
| JP | 03171652 | | 7/1991 |
| JP | 04147652 | | 5/1992 |
| JP | 04206858 | | 7/1992 |
| JP | 05129476 | | 5/1993 |
| JP | 08288686 | | 11/1996 |
| JP | 2003273571 | | 9/2003 |
| WO | WO 2004060034 | | 7/2004 |
| WO | WO 2006076613 | | 7/2006 |

OTHER PUBLICATIONS

Chiu et al. "Wafer-Level Semiconductor Device Packages With Electromagnetic Interference Shielding." U.S. Appl. No. 12/622,393 filed Nov. 19, 2009.

Weng et al., "Semiconductor Package and Manufacturing Methods Thereof." U.S. Appl. No. 12/955,782 filed Nov. 29, 2009.

Liao et al. "Semiconductor Device Packages With Electromagnetic Interference Shielding" U.S. Appl. No. 12/770,645 filed Apr. 20, 2010.

* cited by examiner

SEMICONDUCTOR DEVICE PACKAGES WITH ELECTROMAGNETIC INTERFERENCE SHIELDING

FIELD OF THE INVENTION

The present invention generally relates to semiconductor device packages. More particularly, the invention relates to semiconductor device packages with electromagnetic interference shielding.

BACKGROUND

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference ("EMI"). Smaller sizes of semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

While an electrically conductive casing can reduce EMI, the use of the casing can suffer from a number of disadvantages. In particular, the casing is typically secured to an exterior of a semiconductor device package by an adhesive. Unfortunately, the casing can be prone to peeling or falling off, since binding characteristics of the adhesive can be adversely affected by temperature, humidity, and other environmental conditions. Also, when securing the casing to the package, the size and shape of the casing and the size and shape of the package should match within relatively small tolerance levels. This matching of sizes and shapes and associated precision in relative positioning of the casing and the package can render manufacturing operations costly and time consuming. Because of this matching of sizes and shapes, it also follows that semiconductor device packages of different sizes and shapes can require different casings, which can further increase manufacturing cost and time to accommodate the different packages.

It is against this background that a need arose to develop the semiconductor device packages and related methods described herein.

SUMMARY

Accordingly, one aspect of the present invention is directed to a semiconductor device package with electromagnetic interference shielding.

In one embodiment, a semiconductor device package includes a circuit substrate, an electronic device, an encapsulant, and a conductive layer. The circuit substrate includes a carrying surface, a bottom surface opposite the carrying surface, and a pad. The electronic device is disposed adjacent to the carrying surface and is electrically connected to the circuit substrate. The encapsulant is disposed adjacent to the carrying surface and encapsulates the electronic device. The encapsulant includes a center portion and a peripheral portion surrounding the center portion. A thickness of the peripheral portion is less than a thickness of the center portion, and an opening exposing the pad of the circuit substrate is formed in the peripheral portion. The conductive layer conformally covers the encapsulant and traverses the opening to connect to the pad of the circuit substrate.

In addition, the circuit substrate may include a lateral surface extending between the carrying surface and the bottom surface. The peripheral portion of the encapsulant may include a lateral surface. The lateral surface of the peripheral portion may be substantially coplanar with the lateral surface of the circuit substrate.

In addition, the thickness of the peripheral portion may be substantially uniform.

In addition, the thickness of the conductive layer may be substantially uniform.

In addition, the opening may expose a top surface of the pad, and the conductive layer may cover a sidewall of the opening and the top surface of the pad. The pad may be disposed adjacent to the carrying surface of the circuit substrate.

In addition, the pad may be disposed within the circuit substrate, the opening may penetrate both the peripheral portion of the encapsulant and the circuit substrate, and the conductive layer may cover a sidewall of the opening and may connect to the pad. The pad may be exposed at the sidewall. The pad may also be disposed adjacent to the carrying surface or disposed adjacent to the bottom surface.

In addition, the semiconductor device package may further include a filler disposed in the opening.

In addition, the pad may be grounded.

In addition, the opening may include a circular hole, a linear slot, or a ring-shaped trench.

Another aspect of the present invention is further directed to methods of forming a semiconductor device package with electromagnetic interference shielding. In one embodiment, a method of forming a semiconductor device package includes: (1) providing a circuit substrate strip including a carrying surface, a bottom surface opposite the carrying surface, and a circuit substrate; (2) disposing an electronic device adjacent to the carrying surface, where the electronic device is bonded to the circuit substrate; (3) forming an encapsulant disposed adjacent to the carrying surface and encapsulating the electronic device; (4) performing a half-cutting of the encapsulant along a border of the circuit substrate to form a peripheral portion of the encapsulant extending along the border of the circuit substrate, where a thickness of the peripheral portion is less than a thickness of a center portion of the encapsulant; (5) forming an opening in the peripheral portion to expose a pad of the circuit substrate; and (6) forming a conductive layer to conformally cover the encapsulant, where the conductive layer is connected to the pad of the circuit substrate through the opening.

In addition, the thickness of the peripheral portion may be substantially uniform.

In addition, the method may further include performing a full-cutting of the peripheral portion of the encapsulant along the border of the circuit substrate to separate the circuit substrate from a remainder of the circuit substrate strip and to separate the peripheral portion from a remainder of the encapsulant.

In addition, the opening may be formed by laser drilling. In addition, the pad may be disposed adjacent to the carrying surface of the circuit substrate strip. The conductive layer may cover a sidewall of the opening and a top surface of the pad.

In addition, the opening may be formed by mechanical drilling. In addition, the pad may be disposed in an inner layer of the circuit substrate strip, and the opening may penetrate both the peripheral portion of the encapsulant and the circuit substrate strip. The conductive layer may cover a sidewall of the opening and connect to the pad exposed by the sidewall.

In addition, the method may further include filling the opening after forming the conductive layer, where filling the opening includes electroplating a metal material or printing a non-conductive material into the opening.

BRIEF DESCRIPTION OF THE DRAWINGS

The accompanying drawings are included to provide a further understanding of some embodiments of the invention, and are incorporated in and constitute a part of this specification. The drawings illustrate embodiments of the invention and, together with the description, serve to explain the principles of some embodiments of the invention.

DETAILED DESCRIPTION

Figure 1A:
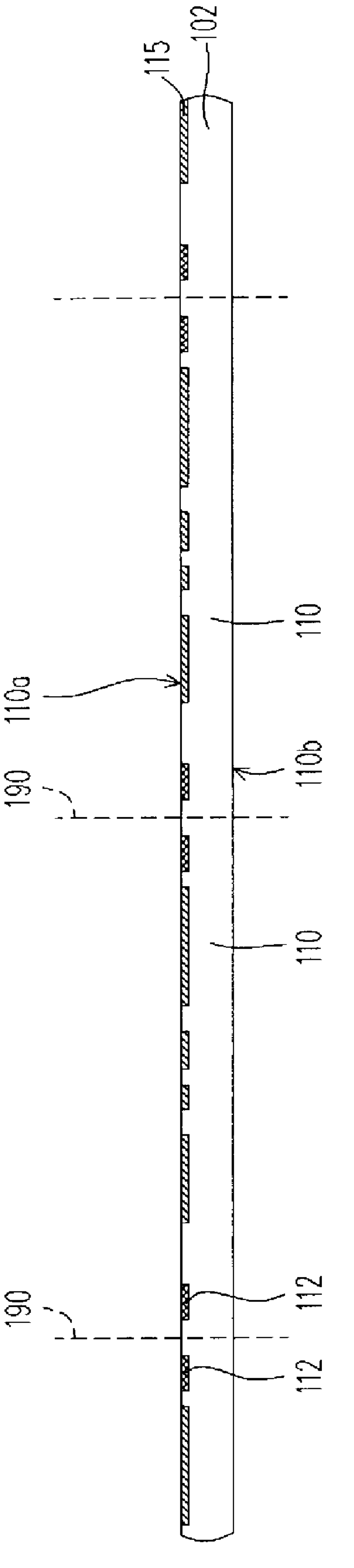
FIGS. 1A through 1H are schematic views showing a method of forming a semiconductor device package according to an embodiment of the present invention.

Reference will now be made in detail to some embodiments of the invention, examples of which are illustrated in the accompanying drawings. Wherever possible, the same reference numbers are used in the drawings and the description to refer to the same or like parts.

DEFINITIONS

The following definitions apply to some of the aspects described with respect to some embodiments of the invention. These definitions may likewise be expanded upon herein.

As used herein, the singular terms “a”, “an” and “the” include plural referents unless the context clearly dictates otherwise. Thus, for example, reference to a grounding element can include multiple grounding elements unless the context clearly dictates otherwise.

As used herein, the term “set” refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term “adjacent” refers to being near or adjoining. Adjacent components can be spaced apart from one another or can be in actual or direct contact with one another. In some instances, adjacent components can be connected to one another or can be formed integrally with one another.

As used herein, terms such as “inner,” “top,” “bottom,” “above,” “below,” “downwardly,” and “lateral” refer to a relative orientation of a set of components, such as in accordance with the drawings, but do not require a particular orientation of those components during manufacturing or use.

As used herein, the terms “connect”, “connected” and “connection” refer to an operational coupling or linking. Connected components can be directly coupled to one another or can be indirectly coupled to one another, such as via another set of components.

As used herein, the terms “substantially” and “substantial” refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms “conductive” refers to an ability to transport an electric current. Electrically conductive materials typically correspond to those materials that exhibit little or no opposition to flow of an electric current. One measure of electrical conductivity is in terms of Siemens per meter (“$S\cdot m^{-1}$”). Typically, an electrically conductive material is one having a conductivity greater than about $10^4$ $S\cdot m^{-1}$, such as at least about $10^5$ $S\cdot m^{-1}$ or at least about $10^6$ $S\cdot m^{-1}$. Electrical conductivity of a material can sometimes vary with temperature. Unless otherwise specified, electrical conductivity of a material is defined at room temperature.

Aspects of the present invention can be used for fabricating various package structures, such as stacked type packages, multiple-chip packages, or high frequency device packages.

FIGS. 1A through 1H are schematic views showing a method of forming a semiconductor device package according to an embodiment of the present invention.

Figure 5:
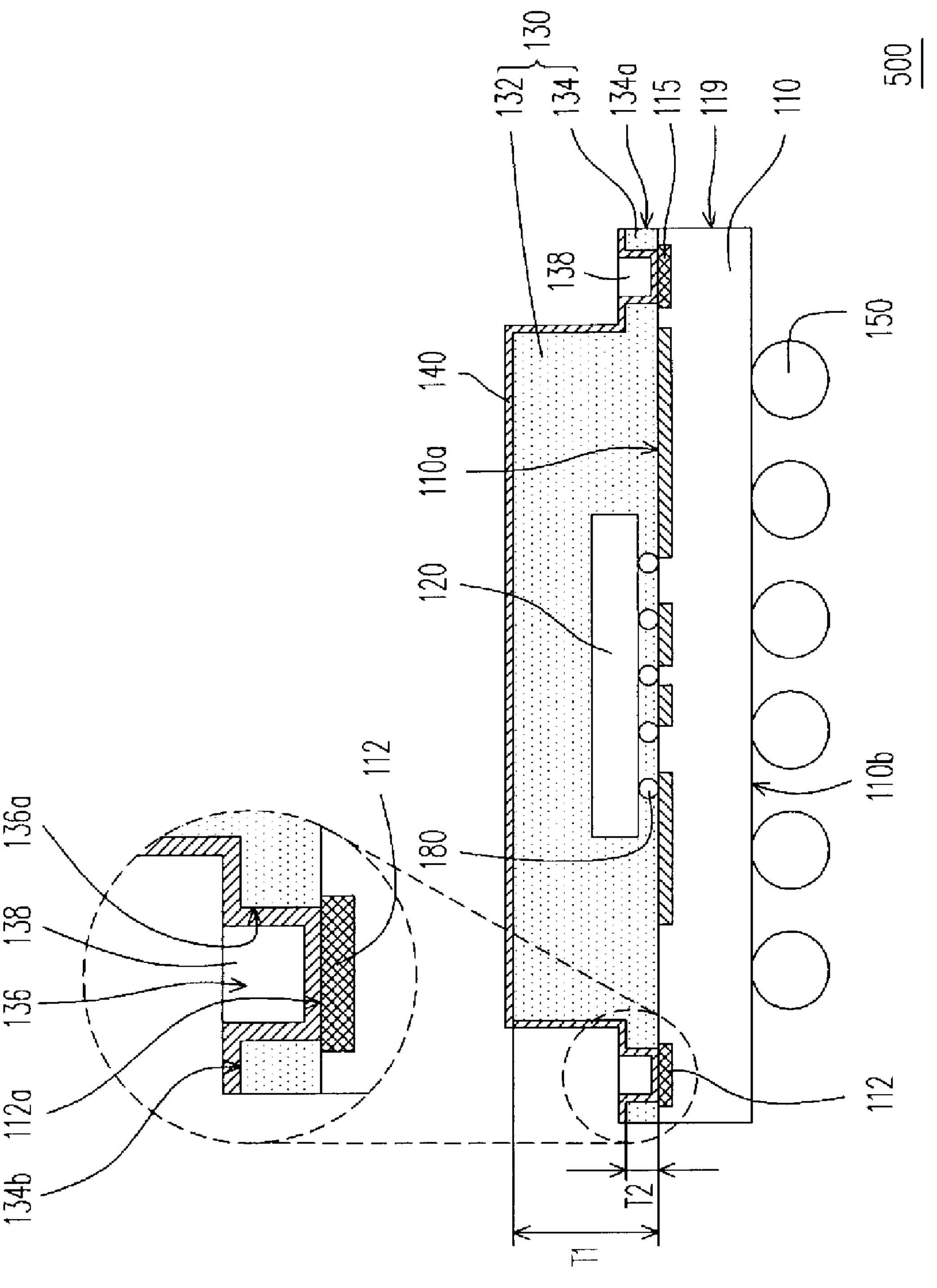
FIG. 5 is a cross-sectional view of a semiconductor device package structure according to an embodiment of the present invention.
Figure 6:
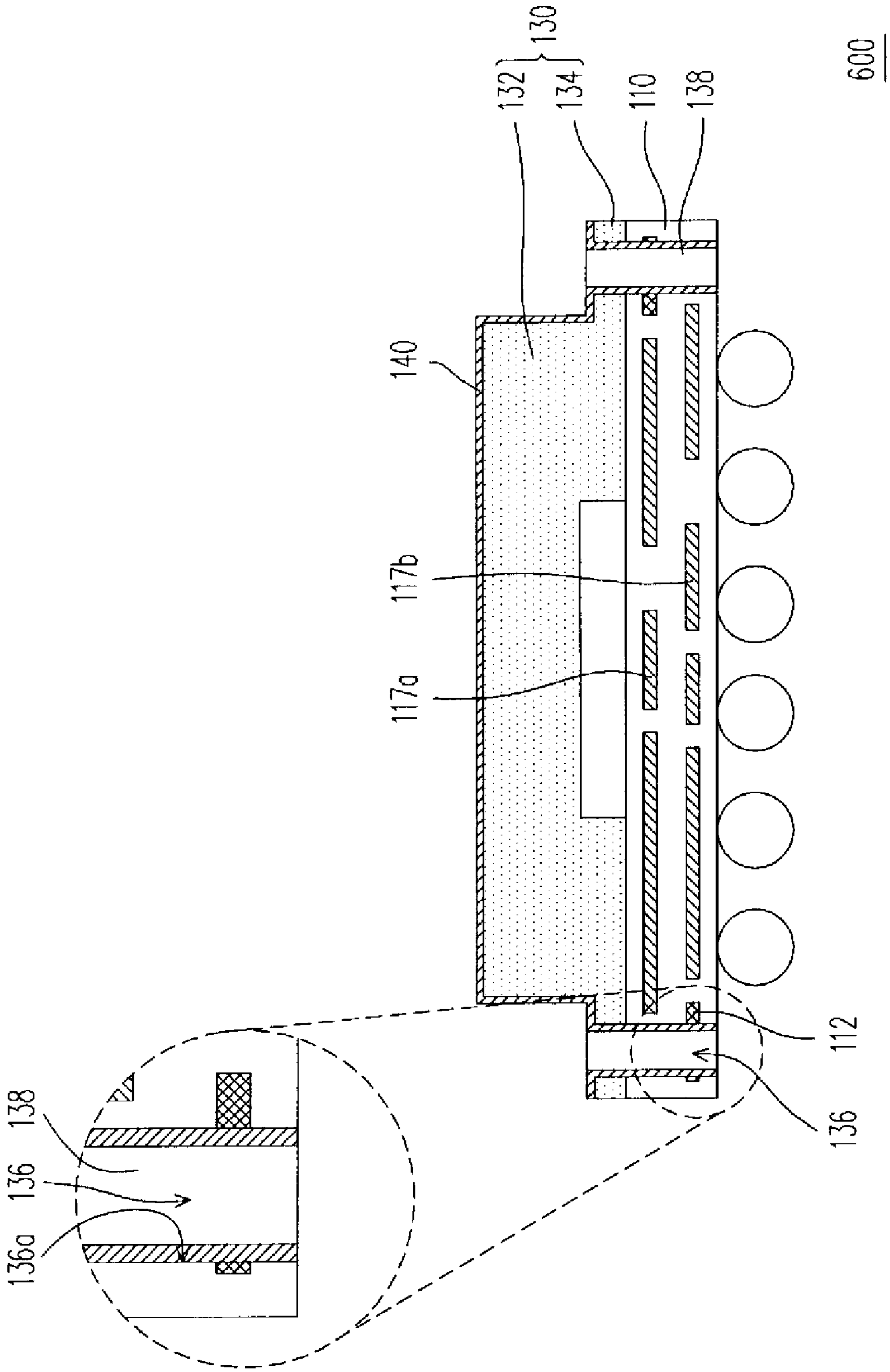
FIG. 6 is a cross-sectional view of a semiconductor device package structure according to another embodiment of the present invention.

Referring to FIG. 1A, a circuit substrate strip 102 having a plurality of circuit substrates 110 defined by the subsequent sawing lines 190 shown as dotted lines is provided, where each circuit substrate 110 includes a carrying surface 110_a_, a bottom surface 110_b_, and a set of pads 112 (or other grounding element) that may be grounded to a ground plane or any other functional or reference plane. Each circuit substrate 110 also may include a lateral surface extending between the carrying surface 110_a_ and the bottom surface 110_b_, as shown in FIGS. 5 and 6 (described below). Like other circuit layers within the circuit substrate 110, the pad 112 may be made of metal, such as copper. The pad 112 may be located on any circuit layer of the circuit substrate 110 and may be integrally formed with (or disposed in) the circuit layer. In this embodiment, the pad 112 is located on the carrying surface 110*a* of the circuit substrate strip 112 and is integrally formed with the top circuit layer 115.

Figure 1B:
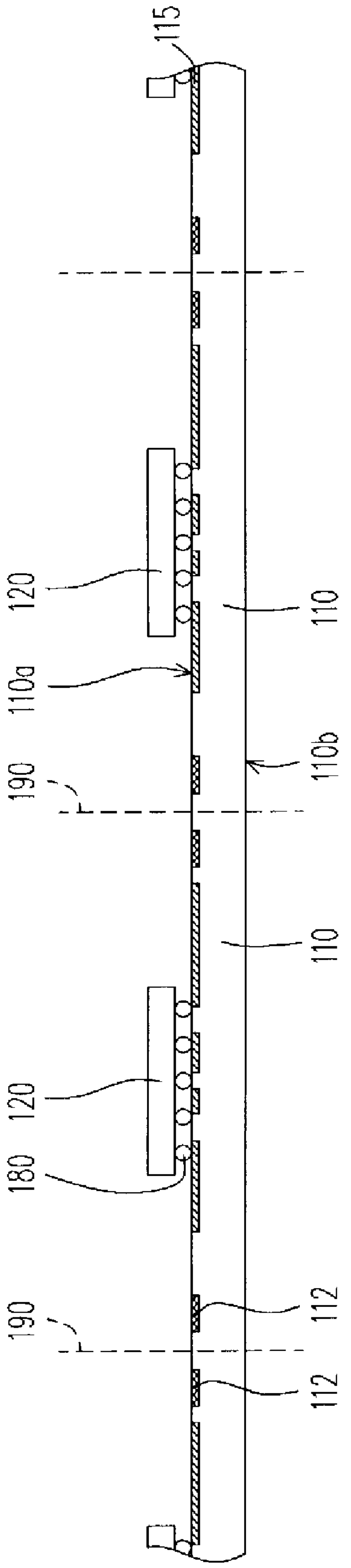

Referring to FIG. 1B, electronic devices 120 (or semiconductor devices 120) are disposed on the carrying surface 110*a* and may be electrically connected to the circuit substrates 110 by flip-chip bonding via a plurality of conductive bumps 180, respectively. In other embodiments, electronic devices 120 may be bonded to the circuit substrate 110 by wire-bonding or other applicable bonding techniques. Herein, the electronic device 120 may be a chip. The electronic device 120 preferably is disposed within a central portion of the circuit substrate 110. In addition, there is no limitation on the number of the electronic device 120 per each circuit substrate 110 in embodiments of the present invention. This embodiment shows bonding one electronic device 120 to each circuit substrate 110. However, in other embodiments, package structures may include multiple electronic devices 120 per circuit substrate 110.

Figure 1C:
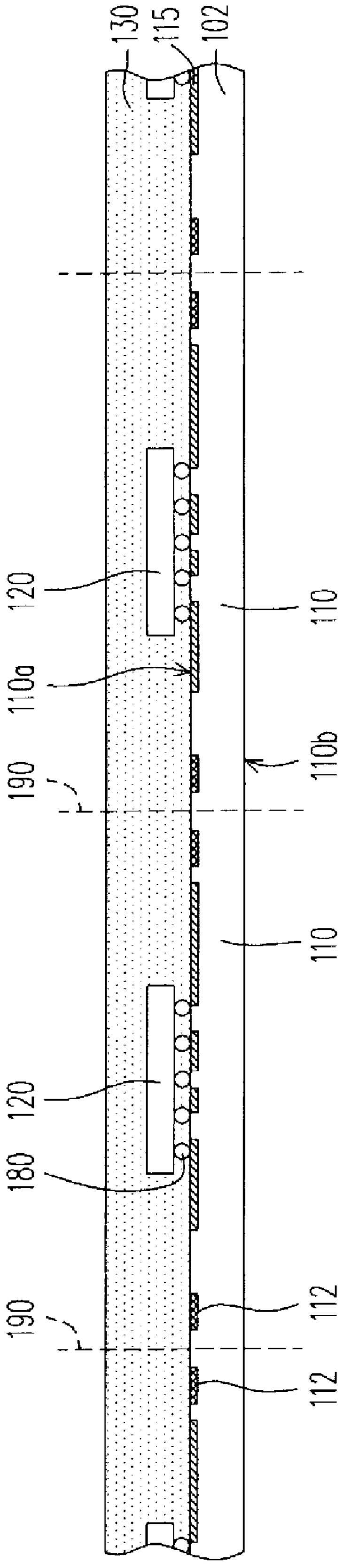

Referring to FIG. 1C, a molding process is carried out to form an encapsulant 130 on the circuit substrate strip 102 to encapsulate the chips 120, the pads 112 and at least a portion of each substrate 110. The molding process can be an over-molding process, for example. The material of the encapsulant 130 may be epoxy resin or silicon resin, for example.

Figure 1D:
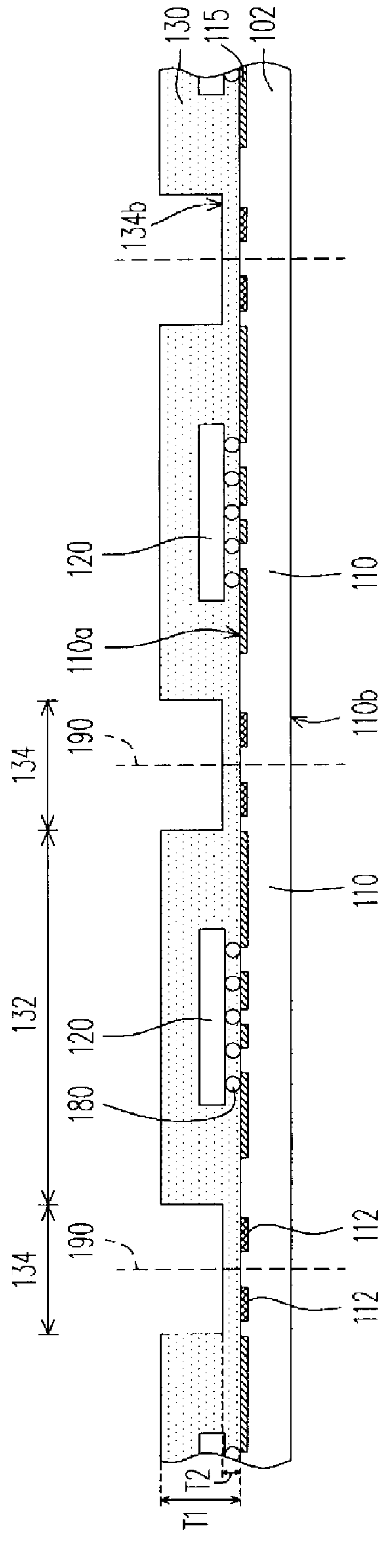

Referring to FIG. 1D, a half-cutting process is performed on the encapsulant 130 along the border of each circuit substrate 110, i.e. along the sawing lines 190, to remove a part of the encapsulant 130. Specifically, the half-cutting process cuts partially through the encapsulant 130 by using a cutting tool (not shown), so that a peripheral portion 134 of the encapsulant 130 is formed on the border of each circuit substrate 110, wherein a thickness T2 of the peripheral portion 134 is less than a thickness T1 of a center portion 132 of the encapsulant 130. Furthermore, the thickness T2 of the peripheral portion 134 may be substantially uniform, i.e. a top surface 134*b* of the peripheral portion 134 may be substantially flat. Since the peripheral portion 134 formed on the border of each of two directly adjacent circuit substrates 110 may be of substantially uniform thickness, the complexity of the half-cutting process to create the peripheral portion 134 may be reduced. For example, the top surface 134*b* across each of two directly adjacent circuit substrates 110 may be formed by a single substantially horizontal cut.

Figure 1E:
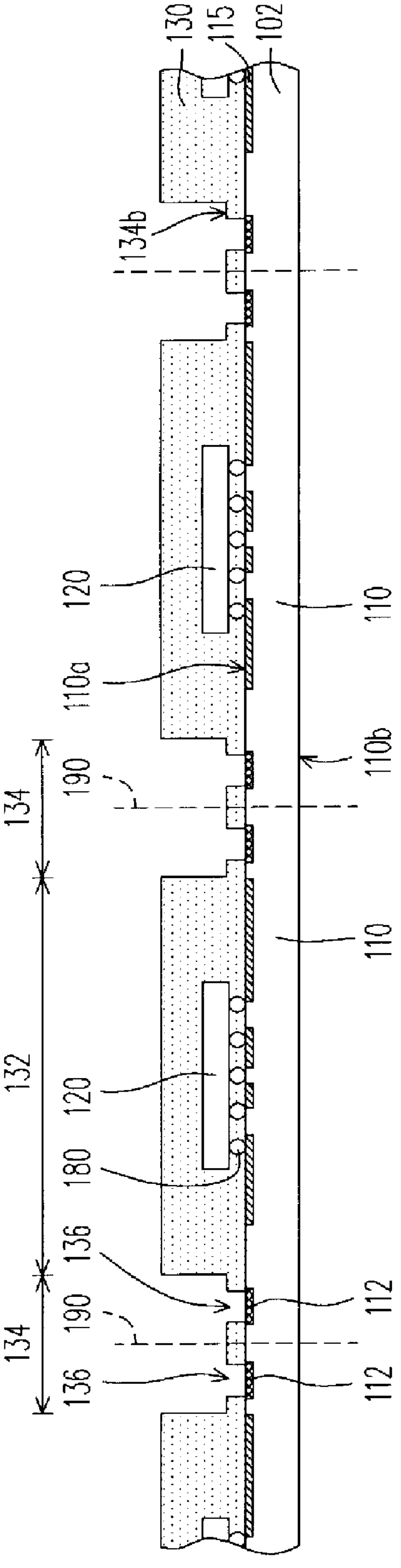

Referring to FIG. 1E, after the half-cutting process, at least one opening 136 is formed in the peripheral portion 134 associated with each circuit substrate 110 to expose the pad 112 of the circuit substrate 110.

Figure 2:
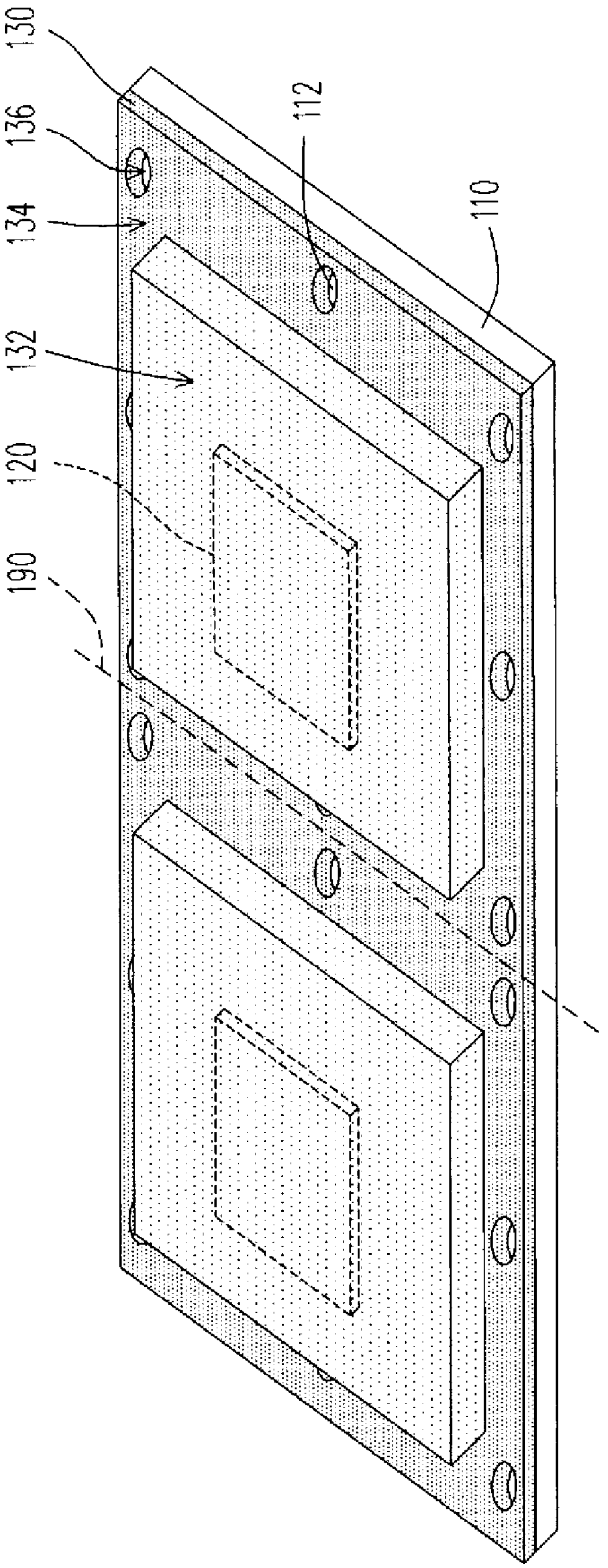
FIG. 2 is an exemplary three-dimensional schematic view showing the structure of FIG. 1E.

FIG. 2 is an exemplary three-dimensional schematic view showing the structure of FIG. 1E. As shown in FIG. 2, plural openings 136 are formed in the encapsulant 130 around each chip 120. In this embodiment, a laser drilling process is adopted. Since a laser has a much higher cutting rate for the encapsulant 130 than metal, the laser drilling process cuts through the encapsulant easily and slows down significantly or stops once the pad 112 is reached. Therefore, the pad 112 on the carrying surface 110*a* of the circuit substrate 110 is exposed through the laser-drilled opening 136 formed in the peripheral portion 134 of the encapsulant 130. Although a laser drilling process is adopted herein, other applicable removal techniques, such as chemical etching or mechanical drilling, can also be employed, and are encompassed within the scope of this invention.

Figure 3C:
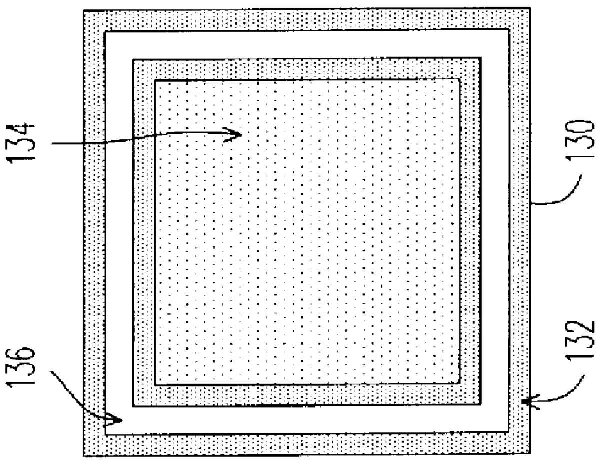
FIGS. 3A-3C are schematic partial top views showing the structure of FIG. 1E according to an embodiment of the present invention.
Figure 3B:
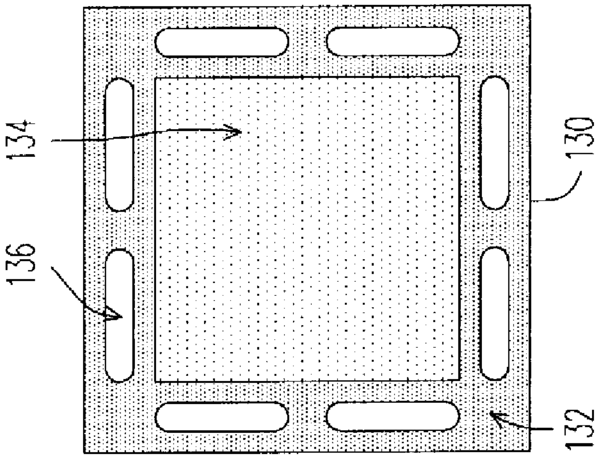
Figure 3A:
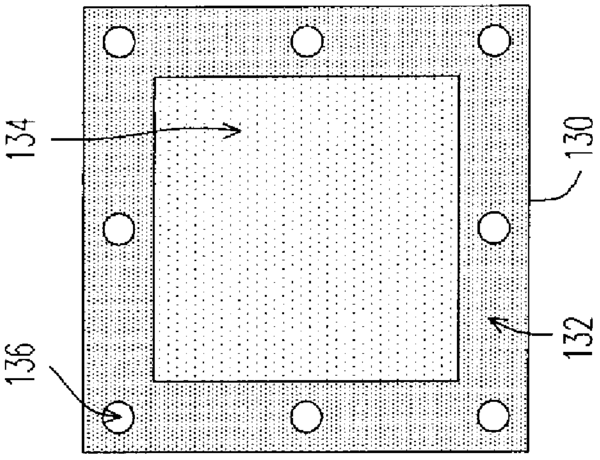

Furthermore, the openings 136 can be shaped to have different profiles to meet various requirements. FIGS. 3A-3C are schematic partial top views showing the structure of FIG. 1E according to an embodiment of the present invention. Referring to FIGS. 3A-3C, various openings 136 having different profiles are presented, where the openings 136 of FIG. 3A are circular holes, the openings 136 of FIG. 3B are linear slots, and the openings 136 of FIG. 3C are ring-shaped trenches. The shape of the pads 112 can be the same as (or similar to) the shape of the openings 136, or can be independently selected.

Figure 1F:
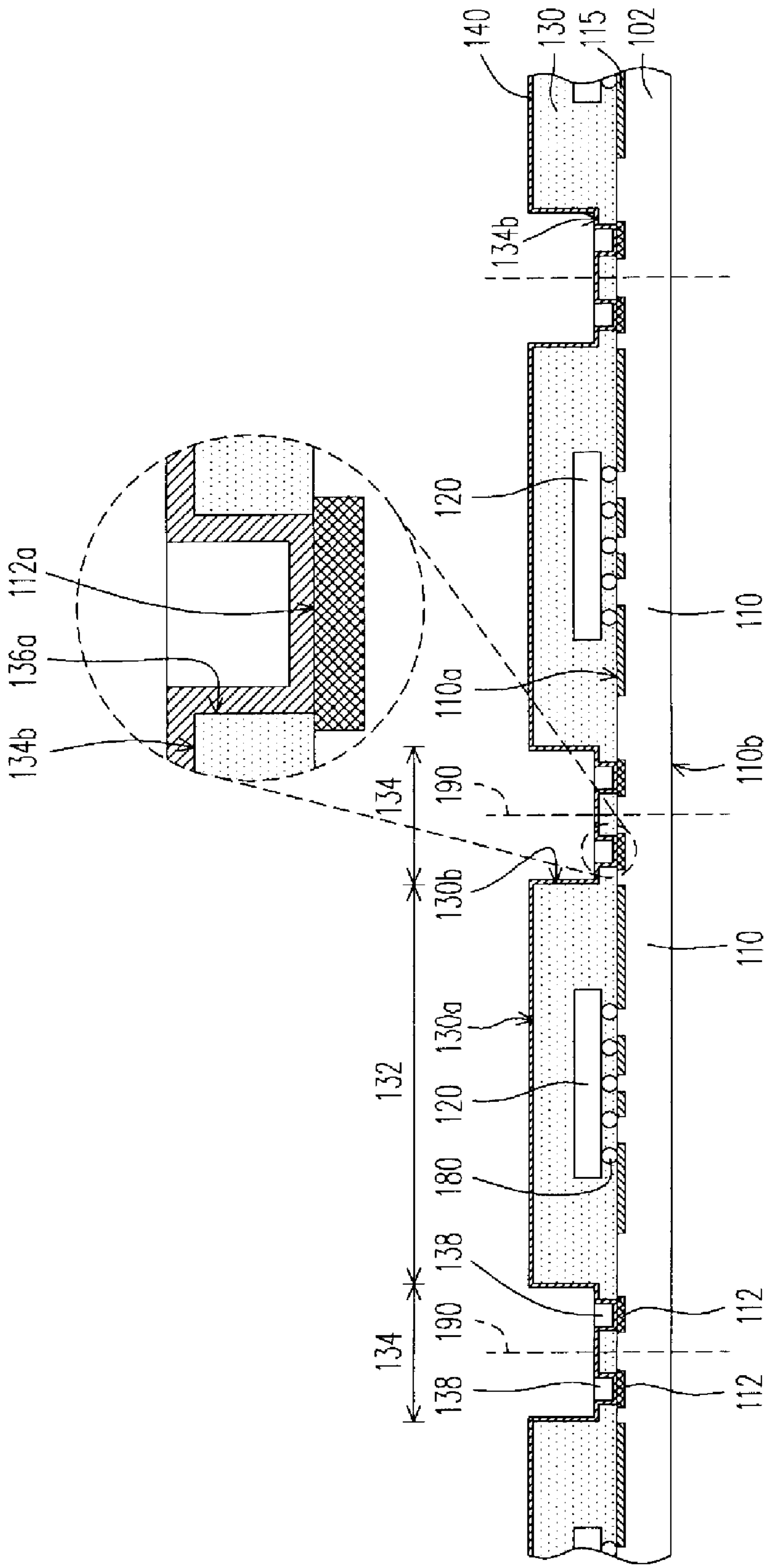

Referring to FIG. 1F, a conductive layer 140 is formed to conformally cover the encapsulant 130, wherein the conductive layer 140 is connected to the corresponding pads 112 of the circuit substrates 110 through the openings 136 in the encapsulant 130. The conductive layer 140 may be an electromagnetic interference shield that is directly applied on the encapsulant 130 without using an extra metal casing, thereby reducing manufacturing cost and time. Specifically, the conductive layer 140 conformally covers the top surface 130*a* of the center portion 132 of the encapsulant 130, the sidewalls 130*b* (or the lateral surfaces 130*b*) of the center portion 132 of the encapsulant 130, the top surface 134*b* of the peripheral portion 134 of the encapsulant 130, the sidewall 136*a* (or the lateral surface 136*a*) of each opening 136, and the top surface 112*a* of each pad 112. The conductive layer 140 can be formed by depositing a metal material to conformally cover the encapsulant 130 and the pads 112 exposed by the openings 136 using a spray coating method, a plating method, or a sputtering method, for example. The metal material can be, for example, aluminum, copper, chromium, gold, silver, nickel, tin, stainless steel, solder material, or combinations thereof. A preferred thickness of the conductive layer 140 is between 1 μM and 20 μm. The thickness of the conductive layer 140 may be substantially uniform.

Furthermore, an optional filling process can be performed after forming the conductive layer 140 to fill the openings 136 with filler 138, thereby providing improved structural rigidity. For example, the filler 138 may be formed by electroplating a metal material or printing a non-conductive material into the openings 136. Embodiments of the present invention provide no limitation on the material included in or the formation of the filler 138.

Figures 1G, 1H:
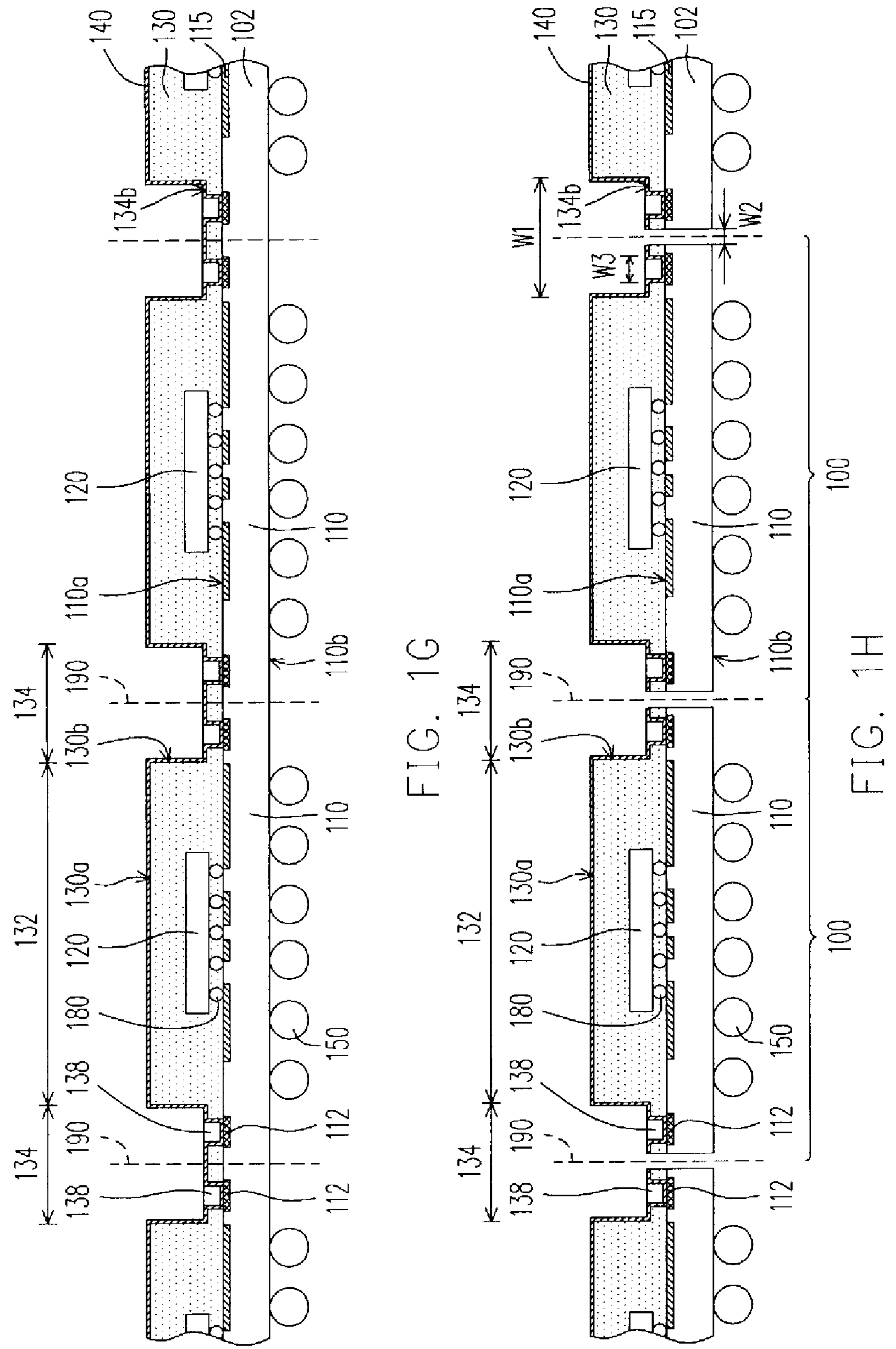

Referring to FIG. 1G, an optional ball mounting process, printing process or other applicable technique may be performed to form a plurality of solder balls 150 on the bottom surface 110*b* of each circuit substrate 110.

Referring to FIG. 1H, a singulation process is performed by full-cutting the peripheral portion 134 of the encapsulant 130 along the border of each circuit substrate 110 (i.e. along the sawing lines 190 shown as dotted lines) to separate the circuit substrates 110 and separate their corresponding portions of the encapsulant 130, so as to obtain plural individual package structures 100. The full-cutting process may be a blade sawing process or a laser cutting process, for example.

Since the half-cutting process is conducted to reduce the thickness of the encapsulant 130 before forming the opening 136 and electrically connecting the conductive layer 140 to the pads 112, the throughput of the package process can be increased because of the reduced time needed to drill the shallow depth of the opening 136.

In general, the width or the depth of the cutting path of the aforementioned half-cutting process or the aforementioned full-cutting process can be altered depending on the shielding requisites or other electrical properties of the package, or even varied in accordance with the processing parameters. Preferably, referring to FIG. 1H, a width W1 of the cutting path of the half-cutting process is between 500 μm and 900 μm, a width W2 of the cutting path of the full-cutting is between 250 μm and 350 μm, and a width W3 of each opening is between 50 μm and 100 μm.

Figure 4A:
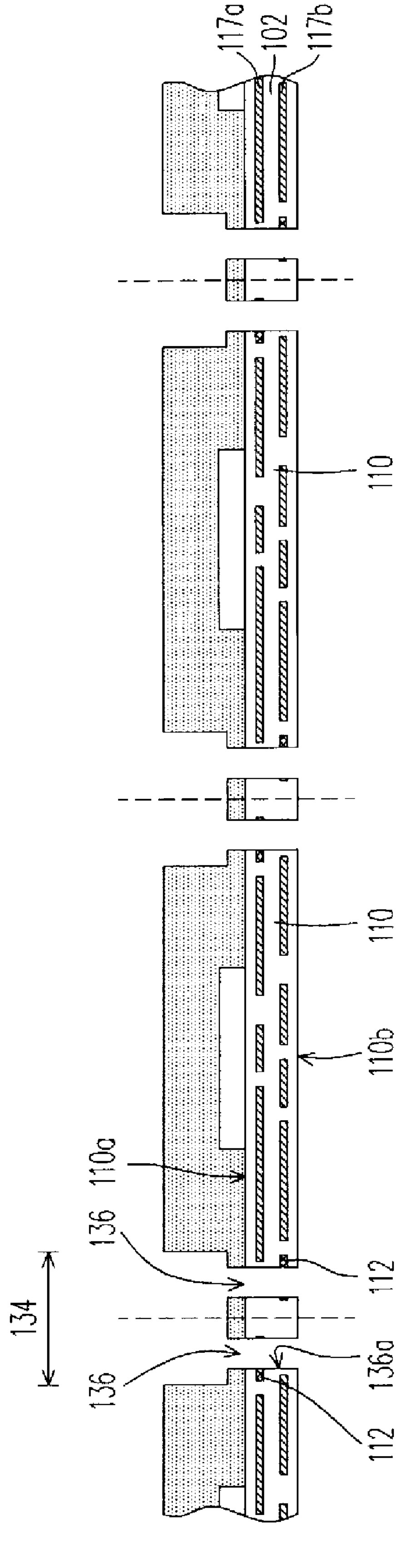
FIGS. 4A though 4D are schematic views showing certain steps of a method of forming a semiconductor device package according to another embodiment of the present invention.

In accordance with embodiments of the present invention, the method of forming a semiconductor device package shown in FIGS. 1A through 1H may be further modified as described for the following embodiments. Alternatively, following the process steps of FIGS. 1A-1D, as shown in FIG. 4A, openings 136 are formed to penetrate both of the peripheral portion 134 of the encapsulant 130 and the circuit substrate strip 102. The pads 112 may be located on the carrying surface 110*a*, on the bottom surface 110*b* or on an inner layer of the corresponding circuit substrate 110. In this embodiment, each pad 112 is formed integrally with the first inner circuit layer 117*a* or the second inner circuit layer 117*b* of the corresponding circuit substrate 110. Mechanical drilling or another applicable technique may be adopted to form the openings 136. Each pad 112 is penetrated by the corresponding opening 136 and is exposed at the sidewall 136*a* of the opening 136.

Figure 4B:
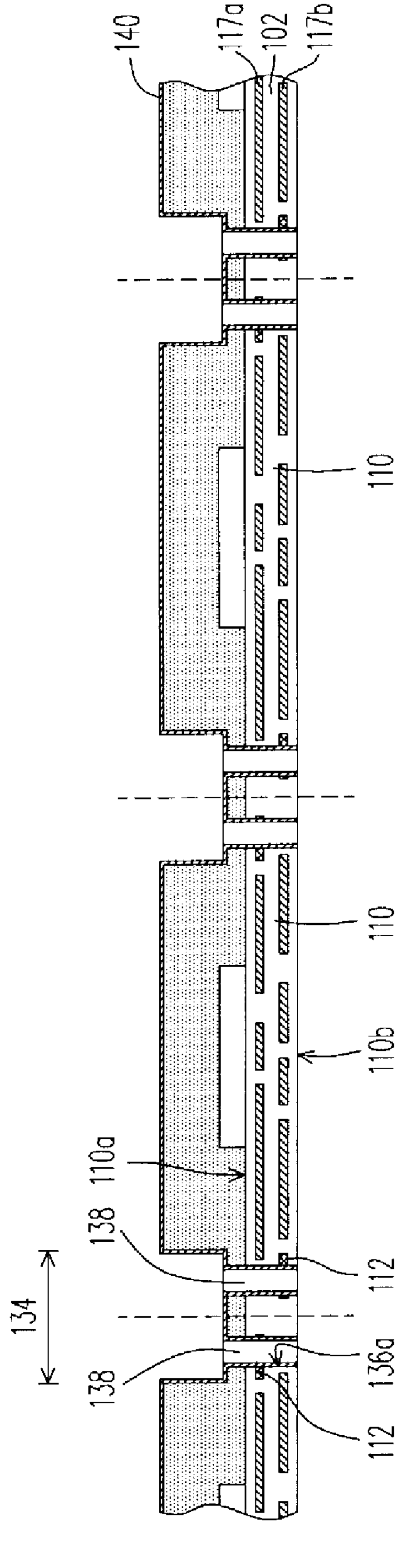

Referring to FIG. 4B, a conductive layer 140 is formed to conformally cover the encapsulant 130, wherein the conductive layer 140 is connected to the corresponding pads 112 through the openings 136 by covering the sidewall 136*a* of each opening 136 and contacting the pad 112 exposed by the sidewall 136*a*. Furthermore, an optional filling process may also be performed to fill the openings 136 with filler 138.

Figure 4C:
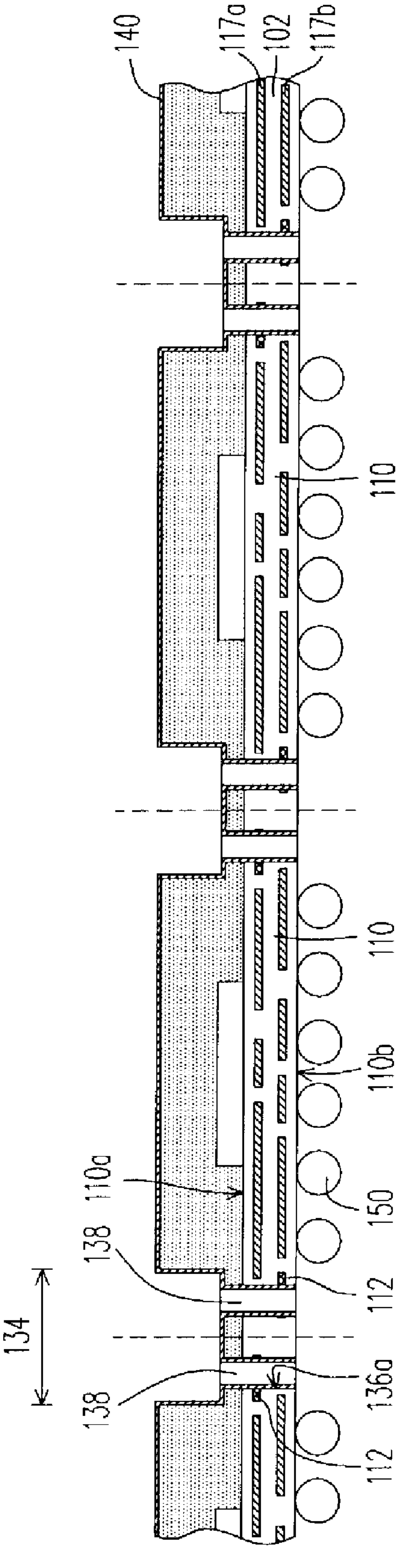
Figure 4D:
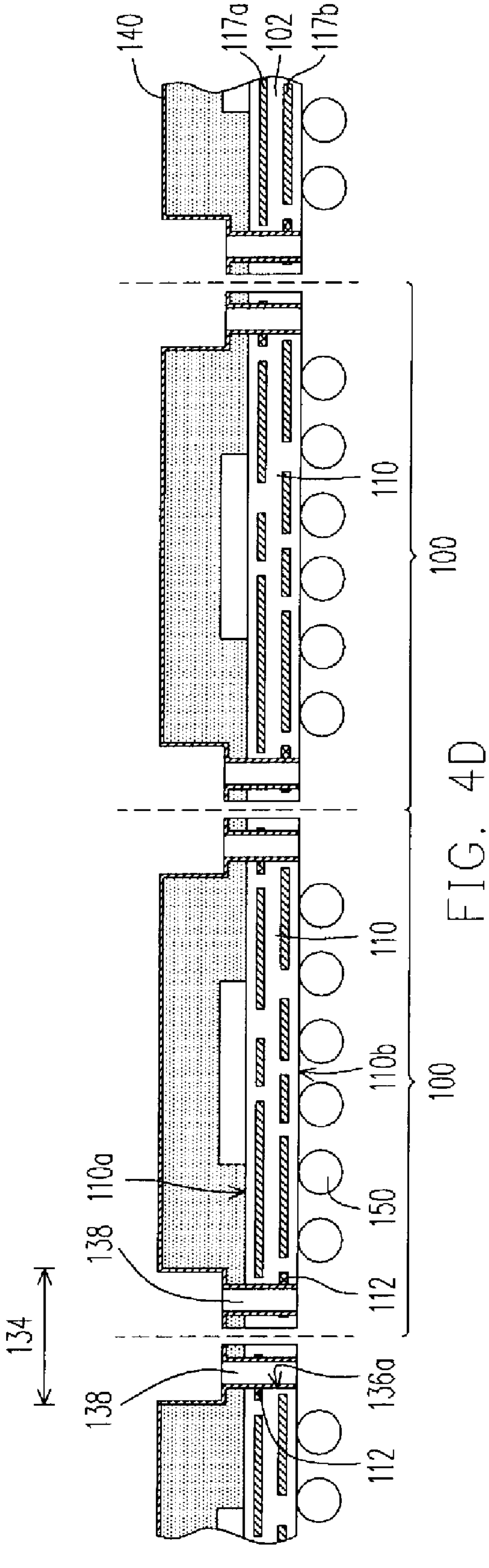

Referring to FIGS. 4C and 4D, an optional ball mounting process is performed to form solder balls 150, and a singulation process may be performed as illustrated above to obtain plural individual package structures 100.

FIG. 5 is a cross-sectional view of a semiconductor device package structure according to an embodiment of the present invention. Referring to FIG. 5, a package structure 500 including a circuit substrate 110, an electronic device 120, an encapsulant 130 and a conductive layer 140 is provided. The circuit substrate 110 can be a laminate substrate, having a carrying surface 110*a* and a bottom surface 110*b*, and provided with at least one pad 112 (FIG. 5 shows two pads 112) for being electrically connected to the conductive layer 140. Herein, the pads 112 may be located on the carrying surface 110*a* of the circuit substrate 110 and electrically connected to a ground plane or any other functional or reference plane. In this embodiment, the pads 112 are integrally formed with a top circuit layer 115 of the circuit substrate 110. The electronic device 120 may be a chip disposed on the carrying surface 110*a* and electrically connected to the circuit substrate 110 by flip-chip bonding via conductive bumps 180, or by other applicable bonding techniques such as wire-bonding. The encapsulant 130 covers the carrying surface 110*a* and encapsulates the electronic device 120 thereon. The encapsulant 130 comprises a center portion 132 and a peripheral portion 134 surrounding the center portion 132, where a thickness T2 of the peripheral portion 134 is less than a thickness T1 of the center portion 132. For example, T2 can be greater than about ⅔ of T1, such as from about ⅒ to about ⅔ of T1, or from about ⅒ to about ½ of T1. The thickness T2 of the peripheral portion 134 may be substantially uniform, i.e. the top surface 134*b* of the peripheral portion 134 may be substantially flat. Furthermore, by performing a singulation process to a strip type package structure to obtain the package structure 500 as illustrated in FIG. 1H, a sidewall 134*a* (or a lateral surface 134*a*) of the peripheral portion 134 of the encapsulant 130 may be coplanar with a sidewall 119 (or a lateral surface 119) of the circuit substrate 110.

The encapsulant 130 has at least an opening 136 (FIG. 5 shows plural openings 136) in the peripheral portion 134 for exposing the pads 112 of the circuit substrate 110. The conductive layer 140 conformally covers the encapsulant 130 and passes through the openings 136 to connect the pads 112 of the circuit substrate 110. The material of the conductive layer 140 may be copper, chromium, gold, silver, nickel, aluminum or alloys thereof, tin, stainless steel, or even a solder material, for example. Each opening 136 exposes a top surface 112*a* of the corresponding pad 112, and the conductive layer 140 covers a sidewall 136*a* of the opening 136 and the top surface 112*a* of the pad 112. The detailed profile of the conductive layer 140 is similar to that shown in FIG. 1F. Also, the detailed profiles of the openings 136 are similar to that shown in FIGS. 3A-3C. A filler 138 made of metal or non-conductive material can be disposed in each opening 136. Hence, by exposing the pads 112 of the circuit substrate 110, the conductive layer 140 can be electrically connected to a ground plane or other reference plane of the circuit substrate 110. For example, an electrical ground path is established within the package structure for EMI shielding, devoid of using an extra ground plane. Solder balls 150 are disposed on the bottom surface 110*b* of the circuit substrate 110.

FIG. 6 is a cross-sectional view of a semiconductor device package structure according to another embodiment of the present invention. Referring to FIG. 6, the package structure 600 is mostly similar to the package structure 500 of FIG. 5, except that the pads 112 are located on the inner layer of the circuit substrate 110 by being integrally formed with the first inner circuit layer 117*a* or the second inner circuit layer 117*b*, and thereby the openings 136 penetrate both of the peripheral portion 134 of the encapsulant 130 and the circuit substrate 110, and the openings 136 are filled by fillers 138. The conductive layer 140 covers a sidewall 136*a* of each opening 136 and connects each pad 112 exposed by the sidewall 136*a*.

In brief, an electrical connection between the conductive layer and the pad of the substrate is established by performing a half cutting process to reduce the thickness of a part of the encapsulant before electrically connecting the conductive layer to the underlying pad, and thereby the throughput of the process can be increased due to a shallow drilling depth. In the package structures of the present embodiment, the conductive layer conformally covers the encapsulant and the circuit substrate and functions as an EMI shielding layer, protecting the package structure from radiation from surrounding radiation sources. The substantially complete coverage of the conductive layer can effectively enhance the EMI shielding efficacy of the package structure. In addition, the reliability of the package can be improved. Moreover, such design is compatible with the packaging of high frequency devices, particularly, radio frequency devices.

It will be apparent to those skilled in the art that various modifications and variations can be made to the structure of embodiments of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device package, comprising:

a circuit substrate including:

a carrying surface;

a bottom surface opposite the carrying surface; and a pad;

an electronic device disposed adjacent to the carrying surface and electrically connected to the circuit substrate;

an encapsulant disposed adjacent to the carrying surface and encapsulating the electronic device, the encapsulant comprising a center portion and a peripheral portion surrounding the center portion, wherein:

a thickness of the peripheral portion is less than a thickness of the center portion;

an opening exposing the pad of the circuit substrate is formed in the peripheral portion;

a conductive layer conformally covering the encapsulant and traversing the opening to connect to the pad of the circuit; and a filler disposed in the opening.

2. The semiconductor device package of claim 1, wherein:

the circuit substrate includes a lateral surface extending between the carrying surface and the bottom surface;

the peripheral portion of the encapsulant includes a lateral surface; and the lateral surface of the peripheral portion is substantially coplanar with the lateral surface of the circuit substrate.

3. The semiconductor device package of claim 1, wherein the thickness of the peripheral portion is substantially uniform.

4. The semiconductor device package of claim 1, wherein the opening exposes a top surface of the pad, and the conductive layer covers a sidewall of the opening and the top surface of the pad.

5. The semiconductor device package of claim 4, wherein the pad is disposed adjacent to the carrying surface of the circuit substrate.

6. The semiconductor device package of claim 1, wherein:

the pad is disposed within the circuit substrate;

the opening penetrates both the peripheral portion of the encapsulant and the circuit substrate; and the conductive layer covers a sidewall of the opening and connects to the pad, the pad being exposed at the sidewall.

7. The semiconductor device package of claim 6, wherein the pad is disposed adjacent to the carrying surface or disposed adjacent to the bottom surface.

8. The semiconductor device package of claim 1, wherein the pad is grounded.

9. The semiconductor device package of claim 1, wherein the opening comprises a circular hole, a linear slot or a ring-shaped trench.

10. A method of forming a semiconductor device package, comprising:

providing a circuit substrate strip including:

a carrying surface;

a bottom surface opposite the carrying surface; and a circuit substrate;

disposing an electronic device adjacent to the carrying surface, wherein the electronic device is bonded to the circuit substrate;

forming an encapsulant disposed adjacent to the carrying surface and encapsulating the electronic device;

performing a half-cutting of the encapsulant along a border of the circuit substrate to form a peripheral portion of the encapsulant extending along the border of the circuit substrate, wherein a thickness of the peripheral portion is less than a thickness of a center portion of the encapsulant;

forming an opening in the peripheral portion to expose a pad of the circuit substrate;

forming a conductive layer to conformally cover the encapsulant, wherein the conductive layer is connected to the pad of the circuit substrate through the; and a filler disposed in the opening.

11. The method of claim 10, wherein the thickness of the peripheral portion is substantially uniform.

12. The method of claim 10, further comprising performing a full-cutting of the peripheral portion of the encapsulant along the border of the circuit substrate to separate the circuit substrate from a remainder of the circuit substrate strip and to separate the peripheral portion from a remainder of the encapsulant.

13. The method of claim 10, wherein forming the opening comprises laser drilling.

14. The method of claim 13, wherein the pad is disposed adjacent to the carrying surface of the circuit substrate strip.

15. The method of claim 13, wherein the conductive layer covers a sidewall of the opening and a top surface of the pad.

16. The method of claim 10, wherein forming the opening comprises mechanical drilling.

17. The method of claim 16, wherein the pad is disposed in an inner layer of the circuit substrate strip, and the opening penetrates both the peripheral portion of the encapsulant and the circuit substrate strip.

18. The method of claim 16, wherein the conductive layer covers a sidewall of the opening and connects to the pad exposed at the sidewall.

19. The method of claim 10, further comprising filling the opening after forming the conductive layer, wherein filling the opening comprises electroplating a metal material or printing a non-conductive material into the opening.

* * * * *